United States Patent
Caltagirone et al.

(10) Patent No.: US 10,235,477 B2
(45) Date of Patent: Mar. 19, 2019

(54) PROTOTYPING AN IMAGE PROCESSING ALGORITHM AND EMULATING OR SIMULATING EXECUTION ON A HARDWARE ACCELERATOR TO ESTIMATE RESOURCE USAGE OR PERFORMANCE

(71) Applicant: NATIONAL INSTRUMENTS CORPORATION, Austin, TX (US)

(72) Inventors: Christophe R. J. Caltagirone, Cedar Park, TX (US); Nicolas F. Vazquez, Austin, TX (US); Dinesh Nair, Bangalore (IN); Bradley D. Buchanan, Austin, TX (US); Jared W. Jenson, Austin, TX (US); Kevin L. Schultz, Georgetown, TX (US)

(73) Assignee: National Instruments Corporation, Austin, TX (US)

( * ) Notice: Subject to any disclaimer, the term of this patent is extended or adjusted under 35 U.S.C. 154(b) by 839 days.

(21) Appl. No.: 14/808,116

(22) Filed: Jul. 24, 2015

(65) Prior Publication Data

US 2016/0034617 A1  Feb. 4, 2016

Related U.S. Application Data

(60) Provisional application No. 62/031,565, filed on Jul. 31, 2014.

(51) Int. Cl.
*G06F 17/50* (2006.01)
*G06F 8/41* (2018.01)
(Continued)

(52) U.S. Cl.
CPC ...... *G06F 17/5009* (2013.01); *G06F 17/5027* (2013.01); *G06F 8/20* (2013.01);
(Continued)

(58) Field of Classification Search
None
See application file for complete search history.

(56) References Cited

U.S. PATENT DOCUMENTS 5,870,493 A * 2/1999 Vogl ............... G06K 9/4628
382/195
6,311,149 B1  10/2001 Ryan
(Continued)

*Primary Examiner* — Kibrom K Gebresilassie
(74) *Attorney, Agent, or Firm* — Meyertons Hood Kivlin Kowert and Goetzel PC; Jeffrey C. Hood

(57) ABSTRACT

System and method for creating a machine vision application. A machine vision prototype comprising a plurality of machine vision steps specifying a machine vision image processing algorithm and associated parameters may be stored. The steps may be interpretable by an emulator to perform the specified image processing on an image by emulating or simulating execution of the steps on a hardware accelerator, e.g., a programmable hardware element or graphics processing unit. An emulator may emulate or simulate execution of the steps on the hardware accelerator, thereby generating image processing results, which may be displayed for validation of the emulating or simulating by a user. The prototype may be analyzed, and based on the analyzing, an estimate of resource usage or performance of the image processing algorithm for the hardware accelerator may be determined and displayed, and may be usable for target platform selection or modification of the image processing algorithm.

23 Claims, 13 Drawing Sheets

(51) Int. Cl.
*G06F 11/32* (2006.01)
*G06F 8/30* (2018.01)
*G06F 8/20* (2018.01)
*G06F 8/34* (2018.01)
*G06F 11/34* (2006.01)

(52) U.S. Cl.
CPC ............... *G06F 8/314* (2013.01); *G06F 8/34* (2013.01); *G06F 8/456* (2013.01); *G06F 11/323* (2013.01); *G06F 11/324* (2013.01); *G06F 11/3466* (2013.01); *Y10S 715/967* (2013.01)

(56) References Cited

U.S. PATENT DOCUMENTS

| | | | |
|---|---|---|---|
| 6,608,638 B1 | 8/2003 | Kodosky | |
| 6,763,515 B1* | 7/2004 | Vazquez | G06F 8/34 715/967 |
| 6,931,633 B1 | 8/2005 | Vazquez | |
| 6,971,066 B2 | 11/2005 | Schultz | |
| 7,079,141 B2 | 7/2006 | Vazquez | |
| 7,146,347 B1* | 12/2006 | Vazquez | G06F 8/34 706/12 |
| 7,765,529 B1* | 7/2010 | Singh | G06F 8/34 717/134 |
| 7,849,416 B2 | 12/2010 | Chandhoke | |
| 7,849,449 B2* | 12/2010 | Andrade | G05B 19/0426 700/32 |
| 7,917,863 B2 | 3/2011 | Chandhoke | |
| 7,937,665 B1* | 5/2011 | Vazquez | G05B 19/0426 715/763 |
| 7,966,162 B1* | 6/2011 | Raghavan | G06T 11/206 703/13 |
| 8,068,660 B2 | 11/2011 | Nair | |
| 8,370,156 B1* | 2/2013 | Torgerson | G06F 17/504 704/1 |
| 8,539,440 B1 | 9/2013 | Liang | |
| 8,640,027 B2 | 1/2014 | Chandhoke | |
| 8,719,774 B2 | 5/2014 | Wang | |
| 8,726,228 B2 | 5/2014 | Ravindran | |
| 8,887,121 B2 | 11/2014 | Ravindran | |
| 2002/0055947 A1* | 5/2002 | Schultz | G06F 8/34 715/209 |
| 2002/0080174 A1* | 6/2002 | Kodosky | G06F 8/34 715/762 |
| 2002/0129333 A1* | 9/2002 | Chandhoke | G06F 8/34 717/107 |
| 2003/0139848 A1* | 7/2003 | Cifra | G05B 19/414 700/245 |
| 2004/0255296 A1* | 12/2004 | Schmidt | G06F 9/4887 718/100 |
| 2006/0282252 A1* | 12/2006 | Ciolfi | G06F 8/10 703/22 |
| 2012/0030646 A1* | 2/2012 | Ravindran | G06F 8/34 717/105 |
| 2013/0031553 A1* | 1/2013 | Hou | G06F 9/4843 718/100 |
| 2013/0191014 A1* | 7/2013 | Dalal | G08G 1/052 701/119 |

* cited by examiner

PROTOTYPING AN IMAGE PROCESSING ALGORITHM AND EMULATING OR SIMULATING EXECUTION ON A HARDWARE ACCELERATOR TO ESTIMATE RESOURCE USAGE OR PERFORMANCE

PRIORITY DATA

This application claims benefit of priority to U.S. Provisional Application 62/031,565, titled "Prototyping an Image Processing Programmable Hardware Element Algorithm and Generating a Corresponding Hardware Configuration Program Implementing Parallelism", filed Jul. 31, 2014, whose inventors were Christophe R. J. Caltagirone, Nicolas F. Vazquez, Dinesh Nair, Bradley D. Buchanan, Jared W. Jenson, and Kevin L. Schultz, and which is hereby incorporated by reference in its entirety as though fully and completely set forth herein.

FIELD OF THE INVENTION

The present invention relates to the field of computer vision, and more particularly to a system and method for prototyping an image processing algorithm and emulating or simulating execution of the image processing algorithm on a hardware accelerator to estimate resource usage or performance.

DESCRIPTION OF THE RELATED ART

Machine vision has become increasingly important in a wide variety of fields, including, for example, quality assurance, automation, manufacturing, and scientific and medical analysis, among others. Machine vision algorithms are often implemented and executed on processor-based systems, e.g., workstations, personal computers, etc., that utilize general purpose processors (central processing units (CPUs)), but are sometimes implemented in hardware, e.g., due to cost, size constraints, performance requirements, etc. For example, a program implementing a machine vision algorithm may be converted to or otherwise used to generate a hardware configuration program that is deployable to a programmable hardware element, e.g., a field programmable gate array (FPGA) to provide a hardware implementation of the algorithm, or compiled for deployment to and execution on a graphics processing unit (GPU). However, in many applications there are tradeoffs between such hardware implementations and processor based solutions, and the developer may not know beforehand which approach to take. Iterating on hardware implementation designs is generally time consuming due to lengthy compile times, and aspects of hardware implementation programming such as parallelization and synchronization that users need to take into account when designing their program. Prior art systems and methods do not adequately address prototyping and generating such hardware implementations, e.g., FPGA specific code.

Graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY OF THE INVENTION

Various embodiments of a system and method for creating machine vision applications are presented herein.

In some embodiments, one or more computers may implement the following techniques. A machine vision prototype may be stored in a memory medium, where the machine vision prototype includes a plurality (e.g., a sequence) of (possibly non-executable) machine vision steps that specify a machine vision image processing algorithm, and in some embodiments, associated parameters. The plurality of machine vision steps may be interpretable by an emulator to perform the specified image processing on an image by emulating or simulating execution of the plurality of machine vision steps on a hardware accelerator. The emulator may emulate or simulate execution of the plurality of machine vision steps on the hardware accelerator, thereby generating image processing results. The image processing results may be displayed on a display for validation of the emulating or simulating by a user. The machine vision prototype may be analyzed, and resource usage or performance of the image processing algorithm may be estimated for the hardware accelerator based on the analyzing. The estimated resource usage or performance may then be displayed on the display. The estimated resource usage or performance may be usable for target platform selection or modification of the image processing algorithm.

In one embodiment, the analyzing may include applying one or more heuristics to determine maximum parallelism of the machine vision image processing algorithm that can be implemented on the hardware accelerator. In some embodiments, a graphical program implementing the specified image processing algorithm may be generated (e.g., automatically), where the graphical program parallelizes at least a portion of the image processing, and where the graphical program is targeted for deployment to the hardware accelerator. For example, generating the graphical program may include determining synchronization signals for the determined parallelism, and generating graphical program code implementing the synchronization signals, where during operation on the hardware accelerator, the synchronization signals may be used to synchronize the parallelized at least a portion of the image processing.

In one embodiment, the storing, emulating or simulating, displaying the image processing results, analyzing, estimating, and displaying the estimated resource usage or performance, may be performed prior to generating the graphical program code. In some embodiments, the hardware accelerator is or includes a programmable hardware element, and a hardware configuration program may be generated based on the graphical program code, where the hardware configuration program is deployable to the programmable hardware element for hardware implementation of the machine vision image processing algorithm. In another embodiment, the hardware accelerator is or includes a graphics processing unit (GPU), and the graphical program code may be compiled for execution on the GPU. In further embodiments, respective portions of the graphical program may be targeted for deployment to a programmable hardware element (PHE) and a GPU, where, once deployed, the PHE and GPU may execute the image processing algorithm cooperatively, i.e., in conjunction.

The graphical program may include a plurality of interconnected nodes that visually indicate functionality of the graphical program, and in some embodiments, may be or include a graphical data flow program.

BRIEF DESCRIPTION OF THE DRAWINGS

A better understanding of the present invention can be obtained when the following detailed description of the preferred embodiment is considered in conjunction with the following drawings, in which.

Figure 1A:
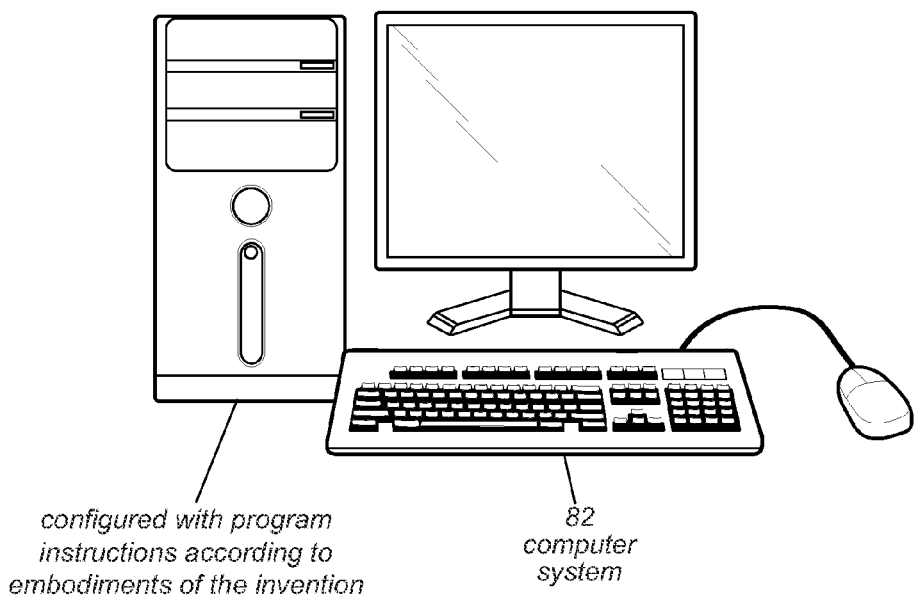
FIG. 1A illustrates a computer system configured to execute a graphical program according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference:

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

U.S. Pat. No. 6,763,515 titled "System and Method for Automatically Generating a Graphical Program to Perform an Image Processing Algorithm", filed Jun. 5, 2000.

U.S. Pat. No. 7,937,665 titled "System and Method for Automatically Generating a Graphical Program to Implement a Prototype, filed Jun. 13, 2000.

U.S. Pat. No. 6,931,633 titled "System and Method of Evaluating the Performance of an Image Processing Algorithm", filed Aug. 1, 2000.

U.S. Pat. No. 7,146,347 titled "System and Method for Automatically Creating a Prototype to Perform a Process", filed Aug. 3, 2000.

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Graphics Processing Unit (GPU)—refers to a specialized electronic circuit configured to efficiently (rapidly) execute algorithms via a highly parallel structure. While originally directed specifically to graphics processing, GPUs are now used more generally, e.g., for non-graphics applications, for high performance computations. Such "generalized" GPUs are referred to as general purpose graphics processing units (GPGPUs). Note that a GPU may include multiple connected GPUs configured to operate in conjunction.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic". Exemplary logical elements that may be implemented on a programmable hardware element include, but are not limited to, registers, flip-flops, look-up tables (LUTs), digital signal processors (DSP), e.g., DSP slices, including, for example, multipliers, accumulators, adders, etc., and block RAM (random access memory) (BRAM), e.g., distributed memory in the programmable hardware element. It should be noted that a programmable hardware element may refer to multiple connected programmable elements operating in conjunction.

Hardware Accelerator—refers to at least one programmable hardware element and/or graphics processing unit configured or programmed to execute an algorithm (e.g., a program) much faster than a general purpose processor or central processing unit (CPU).

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Said another way, data flow programs execute according to a data flow model of computation under which program functions are scheduled for execution in response to their necessary input data becoming available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Prototype—refers to a plurality of (ordered) steps that specify a processing algorithm, where the steps are interpretable by an emulator to perform the specified processing on data, e.g., an image, by simulating execution of the plurality of steps by a programmable hardware element, e.g., an FPGA. Accordingly, a machine vision prototype includes a plurality of machine vision steps that specify an image processing algorithm, where the machine vision steps are interpretable by an emulator to perform the specified image processing on an image by emulating or simulating execution of the plurality of machine vision steps by a programmable hardware element.

Wireless—refers to a communications, monitoring, or control system in which electromagnetic or acoustic waves carry a signal through space rather than along a wire.

Emulation—refers to a hardware and/or software system that duplicates the functions of one system using a different system, so that the second system behaves like (and appears to be) the first system. The focus is on the exact reproduction of the external behavior of the system.

Simulation—refers to a model of a hardware and/or software system that captures the functional connections or relationships between inputs and outputs of the system. The focus is on building a model of the underlying states of the system, e.g., allowing users to analyze and gain a better understanding of how the system operates.

Overview

As noted above, iterative hardware implementation design is typically quite time consuming due to lengthy compile times, and determining aspects of hardware implementation programming such as parallelization and synchronization that users need to take into account when designing their program is generally difficult and error prone.

Embodiments of the techniques disclosed herein may operate to abstract these aspects, letting the user focus on designing the machine vision application, e.g., an image processing algorithm. The system may analyze an algorithm, e.g., in the form of a machine vision (e.g., image processing) prototype designed by the user, to determine which portions of the algorithm (or an implementation of the algorithm) can be parallelized and synchronized, allowing for faster algorithm design iterations.

Important aspects of the techniques may include one or more of: graphical programmable hardware element (e.g., FPGA) code creation, creation of a parallelized program from a machine vision prototype, e.g., a vision algorithm represented sequentially, automatic generation of graphical program code implementing (programmable hardware element) synchronization signals for synchronizing parallelized portions of the algorithm, e.g., where during operation, the signals synchronize parallelized IP (intellectual property) blocks on the programmable hardware element, synchronization of image pixel streams and results, estimation of the programmable hardware element resources used by the generated graphical program code, and estimation of the performance (including latencies) of the programmable hardware element implemented graphical program code, which can then be compared with performance of corresponding program code running on a processor based system, e.g., a host computer.

While the techniques are described below in terms of graphical programs, it should be noted that embodiments of the disclosed techniques may be applied to any type of program desired, including textual and/or graphical programs. Thus, descriptions of the present novel techniques that make reference to or provide examples involving textual or graphical programs in particular should be understood to be broadly applicable to any other program type.

FIG. 1A—Computer System

FIG. 1A illustrates a computer system 82 configured to implement embodiments of the present techniques.

As shown in FIG. 1A, the computer system 82 may include a display device configured to display a program, e.g., a graphical program, as the program is created and/or executed. The display device may also be configured to display a graphical user interface or front panel of the (e.g., graphical) program during execution of the program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Figure 1B:
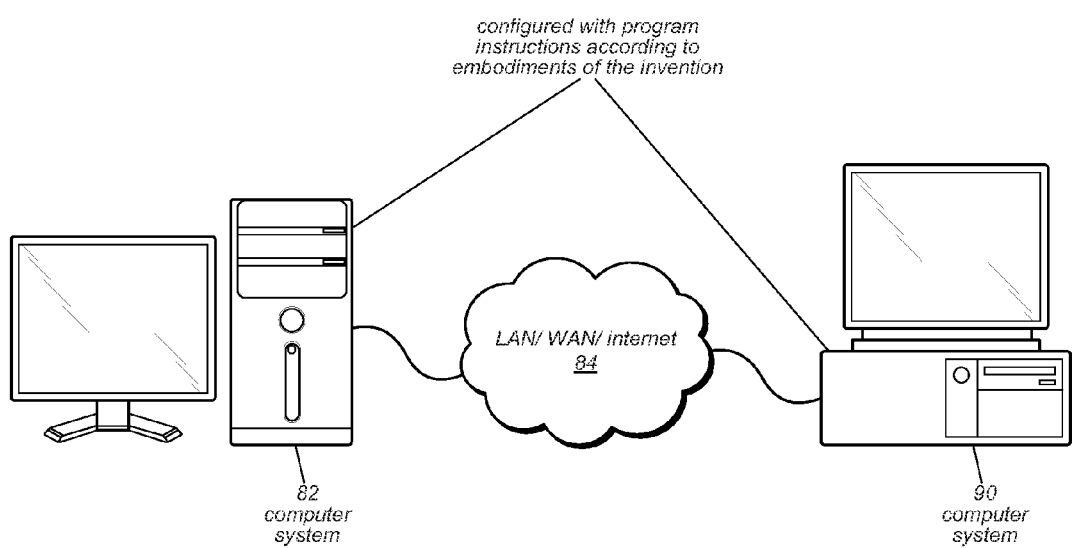
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
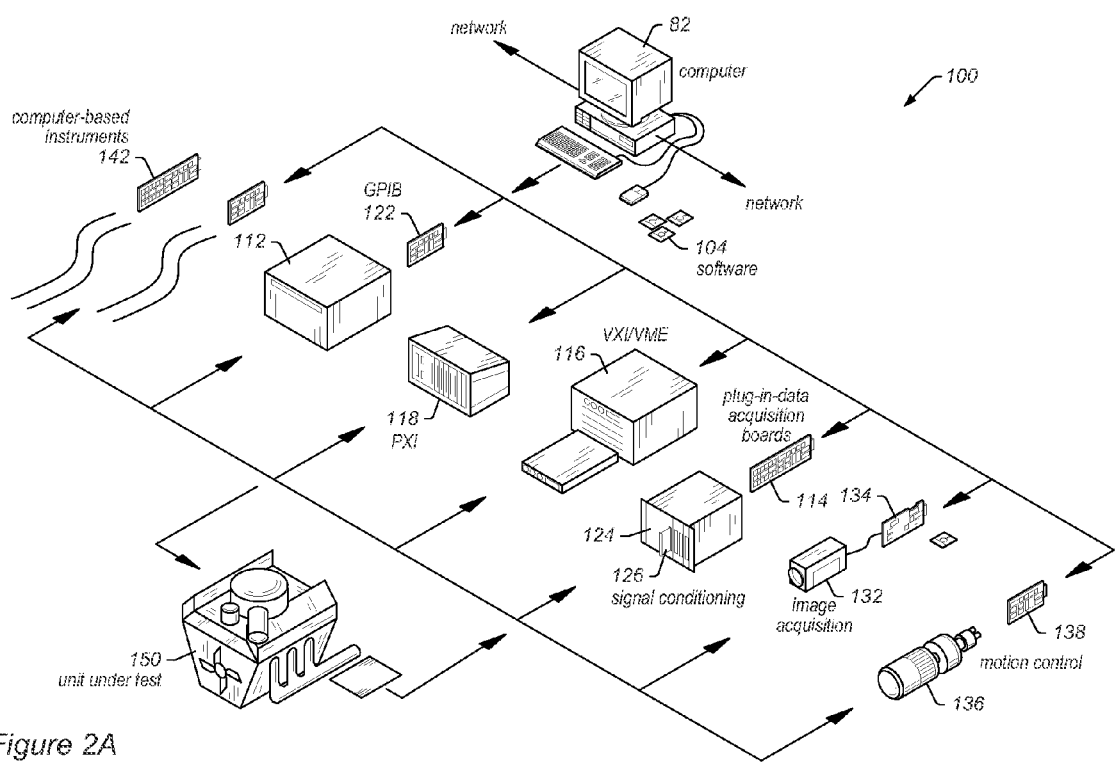
FIG. 2A illustrates an instrumentation control system according to one embodiment of the invention.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
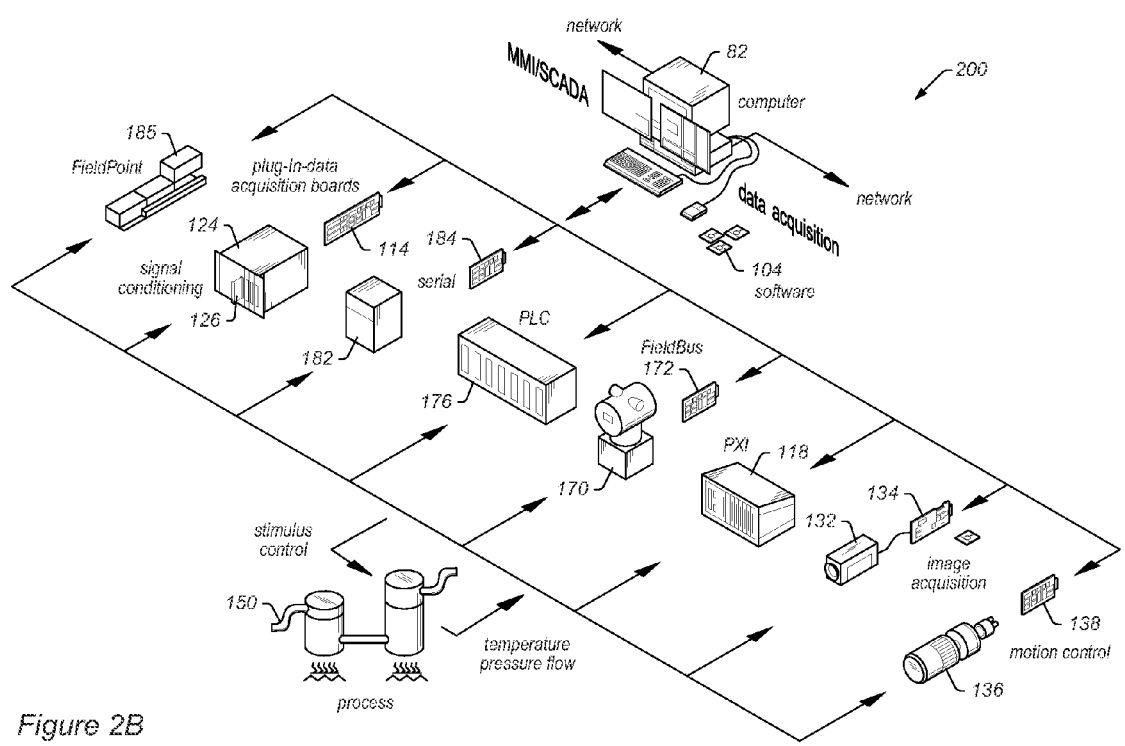
FIG. 2B illustrates an industrial automation system according to one embodiment of the invention.

FIG. 2B illustrates an exemplary industrial automation system 200 which may implement embodiments of the invention. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

Figure 3A:
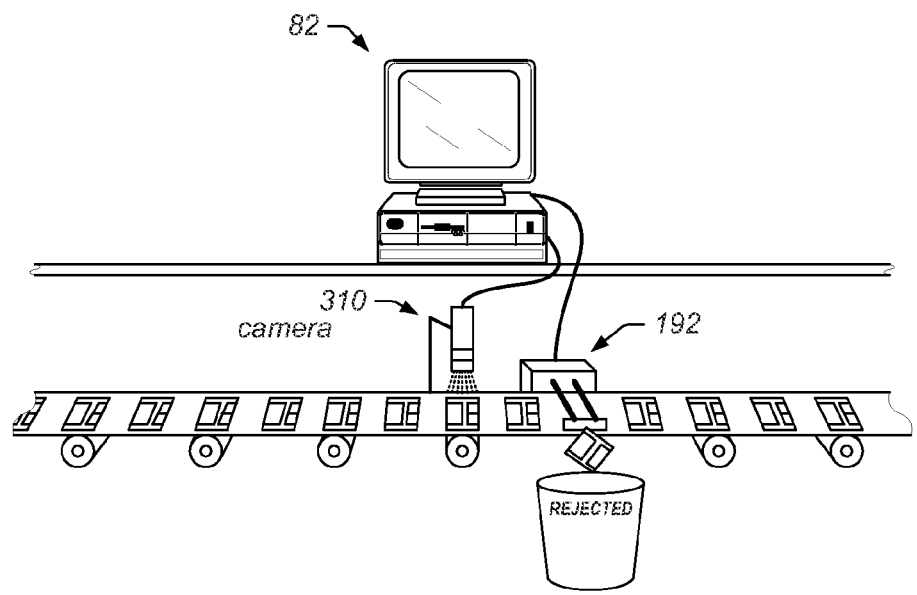
FIG. 3A illustrates an exemplary machine vision system that includes a host computer and a camera, according to one embodiment.
Figure 3B:
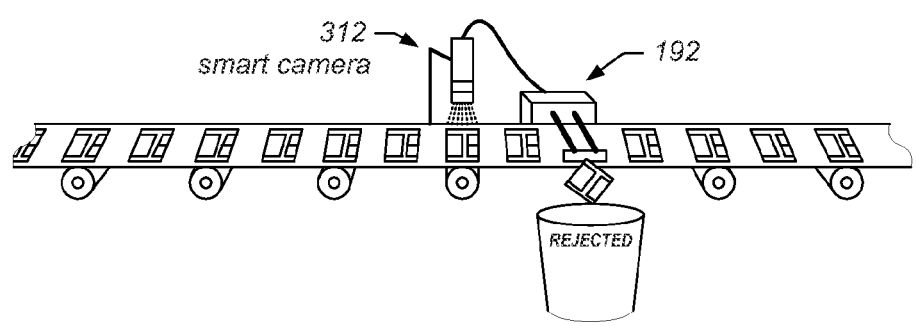
FIG. 3B illustrates an exemplary machine vision system that includes a smart camera and no host computer, according to one embodiment.

FIGS. 3A and 3B—Exemplary Image Processing Systems

FIGS. 3A and 3B illustrate exemplary image processing or machine vision systems to which various embodiments of the invention may be applied. As shown, the exemplary image processing system of FIG. 3A includes a computer 82 and a camera 310, as well as a motion control device 192.

The camera 310 may be or include a digital camera that acquires a digital video signal which includes an image, or a sequence of images, or other data desired to be acquired. In one embodiment, the camera 310 may instead include an analog camera that acquires an analog video signal, and the camera 310 may further include A/D converters for converting the analog video signal into a digital image. Alternatively, the camera 310 may provide analog signals to the computer 82, which may include such converters, e.g., as one or more expansion boards or cards.

In the exemplary embodiment of FIG. 3A, the image is provided to the computer, which may perform any of various image processing functions on the image by executing program instructions of a machine vision application program, e.g., a graphical program implementing a machine vision algorithm, on a processor of the computer 82. It should be noted, however, that the machine vision system of FIG. 3A is exemplary only, and that in other embodiments, the machine vision system may not include a motion control device, or even a camera; for example, the machine vision system may be computer system 82, suitably configured, where the computer system receives images from an external source and executes the machine vision application program to perform image processing on the images.

In contrast, the exemplary image processing system of FIG. 3B includes a smart camera 390 and motion control device 192, but does not include computer system 82. The smart camera 312 may include a digital camera that acquires a digital video signal which is or includes an image, or a sequence of images, or other data to be acquired. Alternatively, the smart camera 312 may instead include an analog camera that acquires an analog video signal, and the smart camera 312 may further include A/D converters for converting the analog video signal into a digital image. Other configurations are also contemplated, the embodiment shown being exemplary only.

The smart camera 312 (or in some embodiments, image acquisition board 134) may include a functional unit, such as a programmable hardware element, e.g., an FPGA, configured to implement the image processing functionality (or algorithm) of a graphical program, per embodiments of the present techniques. For example, the functional unit may be configured to perform an image processing algorithm as represented by a graphical program, where the graphical program may have been first created or generated to implement the image processing algorithm based on a machine vision prototype, as will be described in more detail below, then deployed onto the functional unit of the smart camera to implement the image processing functionality.

Thus, in the machine vision system of FIG. 3B, a digital video signal or digital image may be provided to the functional unit in the smart camera 312, wherein the image processing function may be performed. In other words, in the embodiment of FIG. 3B, the functional unit in the smart camera 312 may perform all of the desired image processing functionality, including optionally performing an operation based on determined characteristics of the image, and hence the computer system 82 is not necessary during operation of the system.

Figure 4A:
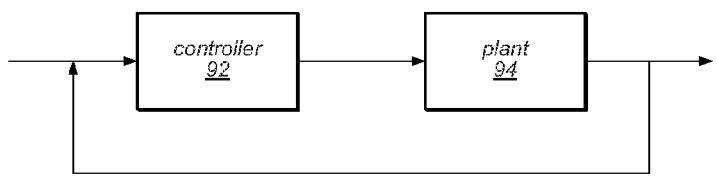
FIG. 4A is a high level block diagram of an exemplary system configured to implement embodiments of the present invention.

FIG. 4A is a high level block diagram of an exemplary system which may be configured to implement embodiments of the present techniques. More specifically, FIG. 4A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 4B:
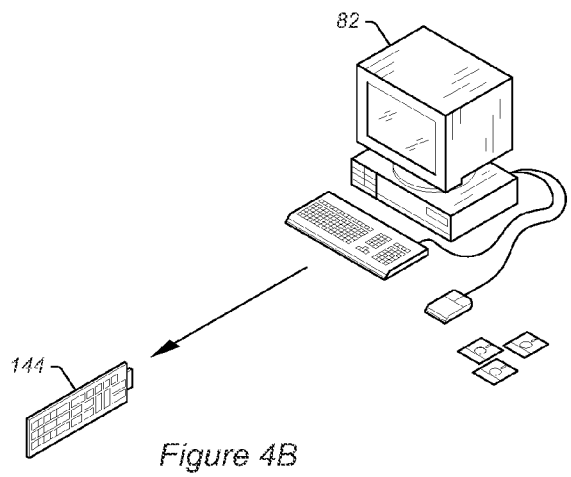
FIG. 4B illustrates an exemplary system which may perform control and/or simulation functions, according to one embodiment.

FIG. 4B illustrates an exemplary system which may perform control and/or simulation functions. As shown, the controller 92 may be implemented by a computer system 82 or other device (e.g., including a processor and memory medium and/or including a hardware accelerator, e.g., a programmable hardware element or GPU) that executes or implements a graphical program. In a similar manner, the plant 94 may be implemented by a computer system or other device 144 (e.g., including a processor and memory medium and/or including a hardware accelerator, e.g., a programmable hardware element or GPU) that executes or implements a graphical program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a hardware accelerator, e.g., a programmable hardware element or GPU.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 1B, 2A, 2B, 3A, and 4B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 5:
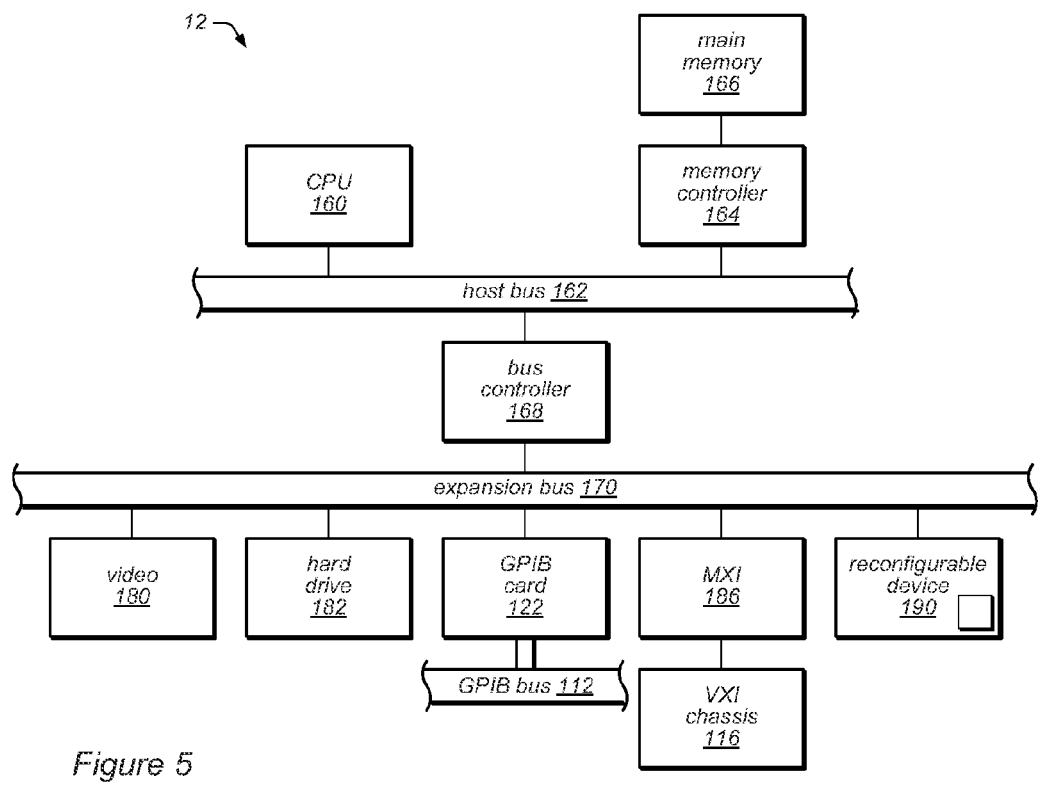
FIG. 5 is an exemplary block diagram of the computer systems of FIGS. 1A, 1B, 2A, 2B, 3A, and 4B, according to one embodiment.

FIG. 5—Computer System Block Diagram

FIG. 5 is a block diagram 12 representing one exemplary embodiment of the computer system 82 and/or 90 illustrated in FIGS. 1A and 1B, or computer system 82 shown in FIG. 1A, 1B, 2A, 2B, 3A, or 4B. It is noted that any type of computer system configuration or architecture can be used as desired, and FIG. 5 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store one or more programs, e.g., graphical programs, configured to implement embodiments of the present techniques, e.g., to create and analyze machine vision prototypes that specify image processing algorithms, and in some embodiments, to generate graphical programs implementing the prototypes and/or hardware configuration programs for configuring programmable hardware elements implementing the image processing algorithms (or executable programs targeted to a GPU). The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a hardware accelerator, e.g., a programmable hardware element, which may be configured with a hardware configuration program generated from a graphical program, which itself, may be generated based on a machine vision prototype, or the device 190 may be configured with a GPU, and the graphical program may be compiled for execution on the GPU, as described below. The computer system may be configured to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code, e.g., an executable, or a hardware configuration program, generated from either the graphical program or from text code that in turn was generated from the graphical program.

Figure 6:
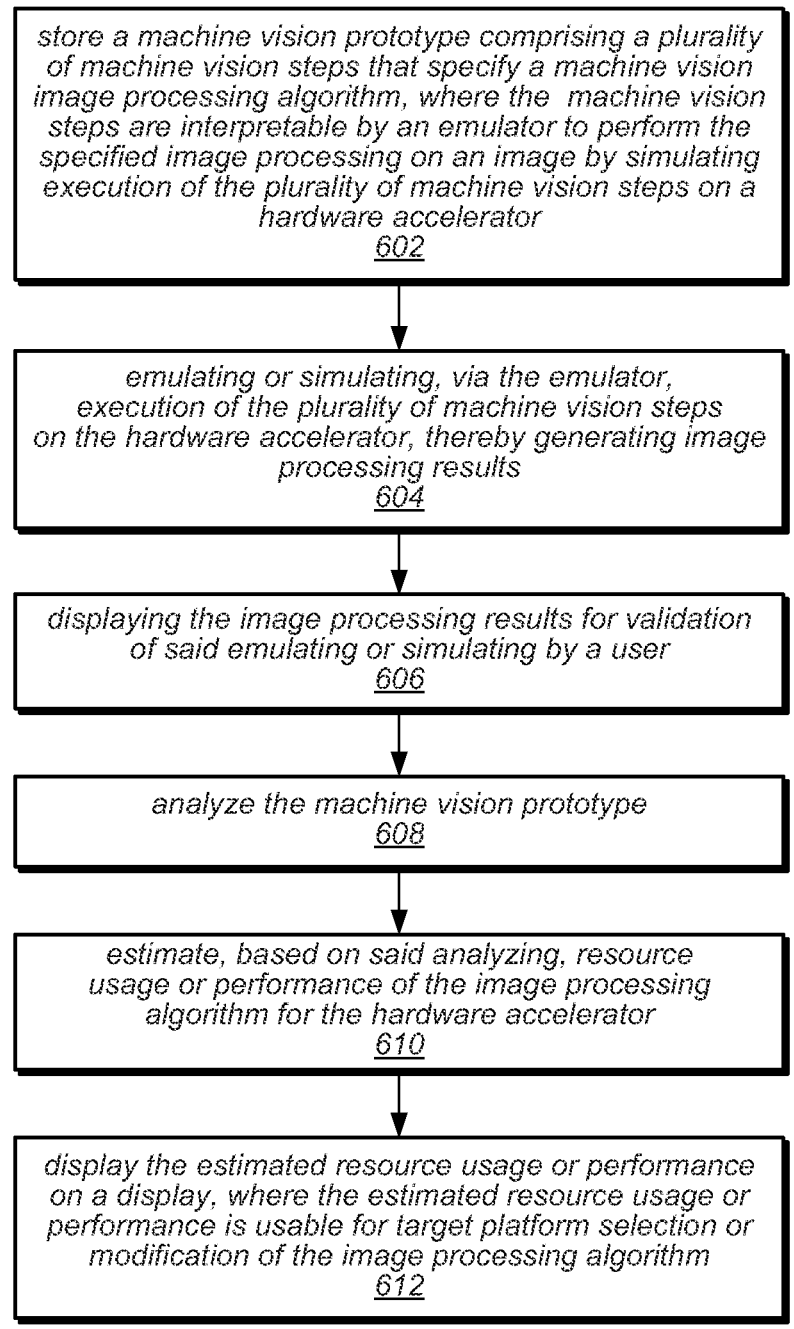
FIG. 6 is a flowchart diagram illustrating one embodiment of a method for creating a machine vision application.

FIG. 6—Flowchart of a Method for Creating Machine Vision Applications

FIG. 6 illustrates a method for creating machine vision applications, according to various embodiments. The method shown in FIG. 6 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

First, in 602, a machine vision prototype may be stored in a memory medium, e.g., of a host computer, e.g., computer 82. As defined above in the Terms section, as used herein, the term "prototype" refers to a plurality of (ordered) steps that specify a processing algorithm, where the steps are interpretable by an emulator to perform the specified processing on an image by emulating or simulating execution of the plurality of steps on a hardware accelerator, e.g., by a programmable hardware element, e.g., an FPGA, or a GPU. Accordingly, a machine vision prototype includes a plurality (e.g., a sequence) of machine vision steps that specify an image processing algorithm, where the machine vision steps are interpretable by an emulator to perform the specified image processing on an image by emulating or simulating execution of the plurality of machine vision steps by a hardware accelerator based system.

The machine vision prototype may be created by a machine vision prototyping environment or development tool, such as, for example, Vision Builder or Vision Assistant, both provided by National Instruments Corporation, in response to user input. In one exemplary embodiment, the user may design the machine vision prototype (e.g., sequence of steps) via a visual "point and click" interface that allows visualizing the result of each vision function applied to the image (i.e., the result of execution of each function block), e.g., where the effects of the selected process or function are displayed to the user. In some embodiments, the prototype may be in the form of a vertical or horizontal (or more generally, linear) sequence of steps (or icons representing steps) that may or may not be connected by (graphical) wires. In one exemplary embodiment, the machine vision prototype may be in the form of an executive sequence. Note, however, that in general, the machine vision prototype may not be limited to linear sequences, but rather, may include more complex topologies, e.g., may include branching, loops, conditionals, or other control structures, as desired. Thus, for example, the prototype may visually resemble a graphical program, such as a LabVIEW graphical program, but is specifically directed to emulation or simulation, not execution. In some embodiments, the steps of the machine vision prototype may be non-executable.

Figure 7A:
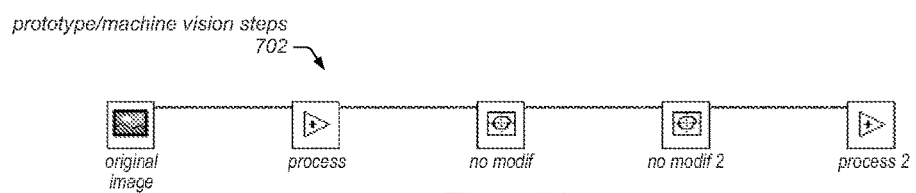
FIGS. 7A and 7B respectively illustrate an exemplary machine vision prototype, and a corresponding parallelized graphical program, according to one embodiment.

FIG. 7A illustrates an exemplary machine vision prototype, where, as may be seen, the prototype is a sequence of machine vision steps. In this particular example, reading from left to right, the steps (represented by respective icons) include: a step labeled "Original Image" representing the image (input) to be processed, a step labeled "Process", which represents a first image processing function, a step labeled "No Modif", which represents a function that does not alter the (version of the) image received to the step as input, a step labeled "No Modif 2", which represents another function that does not alter the (version of the) image received to the step as input, and a step labeled "Process 2", which represents a second image processing function.

In 604, execution of the plurality of machine vision steps on the hardware accelerator may be emulated or simulated by an emulator, thereby generating image processing results. In other words, an emulator may interpret the plurality of image processing steps of the machine vision prototype, and emulate or simulate execution (or operation) of the steps on the hardware accelerator. This emulated or simulated execution of the steps generates image processing results, e.g., a processed image or image sequence, string, numerical or Boolean results, etc.

In 606, the image processing results may be displayed, e.g., on a display of computer 82, for validation of said emulating or simulating by a user. For example, the method may display a processed image that resulted from application of the image processing steps of the prototype, which the user may use to visually validate that the emulation or simulation did, in fact, perform the specified image processing. Note that if this method element weren't performed, the user would have no way of knowing if the emulation or simulation properly performed the specified image processing.

In 608, the machine vision prototype may be analyzed. For example, the machine vision prototype may be analyzed with regard to parallelization and/or synchronization. These aspects are important at least because processor based platforms and hardware accelerator based platforms have very different attributes that determine efficiencies, latencies, and performance in general, of implementations thereon. For example, while the speed of sequential execution of program instructions by a processor generally determines these attributes for a processor based platform, such as computer 82, hardware accelerator based platforms can employ parallel processing paths implemented in hardware, and so have different constraints and efficiencies from processor based platforms. Thus, various parallelization schemes may produce corresponding efficiency and/or performance gains when implemented on a hardware accelerator.

In one embodiment, said analyzing may include applying one or more heuristics to determine parallelism, e.g., approximately maximum parallelism, of the machine vision image processing algorithm (as represented by the machine vision prototype) that can be implemented on the hardware accelerator. More generally, in some embodiments, the method may apply one or more heuristics to determine opportunities for parallelization and/or related possibilities or requirements for synchronization of parallelized functionality, e.g., via addition of synchronization blocks and/or signals.

For example, in one embodiment, the method may analyze the prototype to determine opportunities for such parallelization by identifying consecutive steps that do not modify the image each receives as input. Since each of these steps has no effect on its respective immediately previous step, each step and its respective previous step may be parallelized without affecting the result of the algorithm. Thus, turning again to the example of FIG. 7A, the sequential "No Mod" steps ("No Modif" and "No Modif 2") may be parallelized with the preceding "Process" step, where "No Modif" is parallelized with "Process", and "No Modif 2" is parallelized with "No Modif" (or vice versa), resulting in parallelization of all three steps.

Alternatively, or in addition to parallelizing consecutive steps that do not modify the image, the method may analyze the prototype regarding the use of image buffers to parallelize any portion of the prototype that can be parallelized. Said another way, in some embodiments, the method may analyze the prototype for parallelization via identification or detection of the (specified) use of image buffers, e.g., to parallelize portions of step sequences. Note, for example, that to be able to 1) apply different processing functions (steps) on the same image, or 2) apply a function that takes two images as input, the method (e.g., implemented by, e.g., Vision Assistant or some other machine vision tool) may use the concept of image buffers, where, for example, the algorithm may store images in different buffers, and either retrieve the image from a buffer later in the plurality (e.g., sequence) of steps, or insert a step that processes the current image along with that stored in the buffer.

Figure 8A:
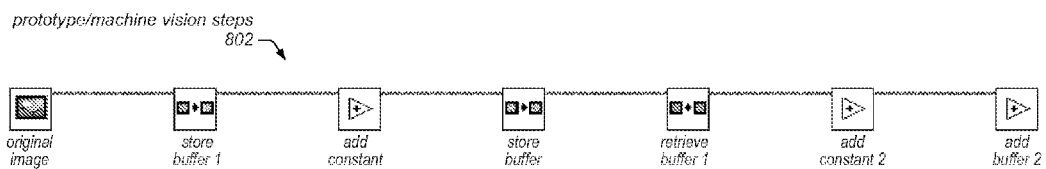
FIGS. 8A and 8B respectively illustrate an exemplary machine vision prototype, and a corresponding parallelized graphical program with a synchronization block, according to one embodiment.
Figure 8B:
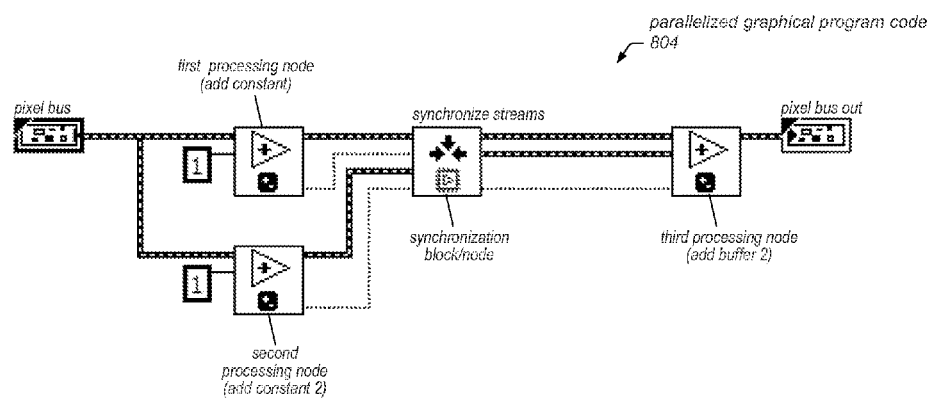

FIG. 8A illustrates another exemplary machine vision prototype, again sequential, where, as may be seen, after the original image to be processed is received (via step "Original Image"), the image is stored in a first buffer in (by) step "Store Buffer 1", and the image is modified by addition of some kind of constant in (by) step "Add Constant", after which the resulting (modified) image is stored in a second buffer in (by) step "Store Buffer 2", after which the original stored image is retrieved from the first buffer in (by) step "Retrieve Buffer 1", and a second constant added to the retrieved image in (by) step "Add Constant 2". Finally, as FIG. 8A also shows, the resulting image from "Add Constant 2" is further modified by addition of the modified image that was stored in the second buffer in (by) step "Add Buffer 2".

Accordingly, by identifying these two patterns (i.e., sequences of "no mod" steps, and use of image buffers), the steps in between the Store Buffer and Retrieve Buffer steps (of FIG. 8A), or, where such explicit retrieval is not required, between a Store Buffer step and a subsequent step that processes contents of the buffer, may be parallelized.

Summarizing the above, to parallelize the algorithm (specified by the prototype), the method may identify several aspects of the machine vision prototype (implementing the image processing algorithm) and may follow one or more of these rules or heuristics:

1) A step that does not modify the image can be executed in parallel with the previous step; and 2) The use of image buffers indicates opportunities to parallelize some steps in the prototype.

Thus, in some embodiments, the method may include applying one or more heuristics to determine maximum parallelism of the machine vision image processing algorithm that can be implemented on the hardware accelerator.

In one embodiment, the method may include generating a graphical program implementing the specified image processing algorithm. The graphical program may parallelize at least a portion of the image processing (algorithm), and may be targeted for deployment to the hardware accelerator. In other words, the method may generate graphical program code, i.e., a graphical program, based on the machine vision prototype. For example, returning to the example machine vision prototype of FIG. 7A, the method may generate a corresponding graphical program, such as, for example, a LabVIEW™ graphical program, that provides the specified functionality of the machine vision prototype, while parallelizing at least some of the steps (or more specifically, the specified functionality of the steps). Note that in various embodiments, the graphical program may be any type of graphical program desired. For example, in one embodiment, the graphical program may include a plurality of interconnected nodes that visually indicate functionality of the graphical program. In a further embodiment, the graphical program may be or include a graphical data flow program.

Figure 7B:
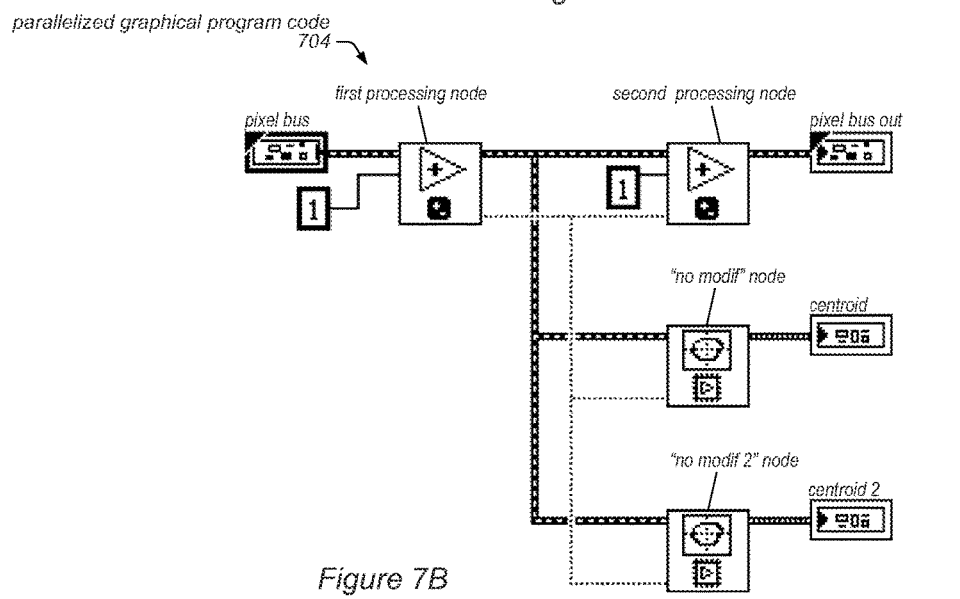

FIG. 7B illustrates a parallelized graphical program 704 corresponding to the exemplary machine vision prototype of FIG. 7A, discussed above, according to one embodiment. As may be seen, in the particular example of FIG. 7B, a pixel bus terminal or node provides a pixel stream from an input image, i.e., the original image of FIG. 7A, to a first processing (function) node, whose output (processed pixel stream) is provided to a second processing (function) node, and further, to first and second "no mod" function nodes that do not modify their input data (but rather determine respective centroid values), and thus are parallelized with the second processing node, per the above "no mod" step sequence heuristic. As also shown, the second processing node processes the input pixel stream (received from the first processing node) and provides an output pixel stream to a pixel bus out terminal or node.

Thus, based on the machine vision prototype of FIG. 7A and the "no mod" step sequence heuristic discussed above, the graphical program of FIG. 7B may be generated, where some of the image processing steps of the image processing algorithm have been parallelized.

As another example, consider the machine vision prototype 802 of FIG. 8A, and an exemplary corresponding graphical program 804 automatically generated based on the prototype. As discussed above, analyzing the machine vision prototype 802 identifies these two (heuristic) patterns (i.e., sequences of "no mod" steps, and use of image buffers), indicating that the steps in between the Store Buffer and Retrieve Buffer steps (of FIG. 8A), or, where such explicit retrieval is not required, between a Store Buffer step and a subsequent step that processes contents of the buffer, may be parallelized. Accordingly, note the parallelized first and second processing nodes in the graphical program 804 corresponding to the "Add Constant" and "Add Constant 2" steps of the prototype 802 (based on the identification of the use of image buffers), and the addition of a synchronization block (or node) to synchronize the two pixel streams output from the first and second processing nodes, which are then received by a third processing node which adds the two received pixel streams (thereby adding the modified contents of buffer 1 with the contents of buffer 2), and outputs the resulting pixel stream to a pixel bus out terminal or node.

Note that the Store Buffer and Retrieve Buffer steps are then equivalent to branching the image wire in the parallelized graphical program code.

Thus, the analysis determined that, given the parallelism of the first and second processing steps (Add Constant and Add Constant 2 of prototype 802), and the need to add corresponding resulting pixel streams (at the pixel level), the pixel streams require synchronization prior to their summing, and so generating the graphical program (code) further included addition of a synchronization block or node, as shown.

In some embodiments, the method may also provide for automatic generation of synchronization signals that may be used to ensure that data are not lost if there is a temporary bottleneck in the processing chain (implemented on the hardware accelerator), or data inconsistencies due to combining two pixel streams (e.g., in a node) without synchronization at the pixel level. For example, when synchronizing multiple (e.g., two) streams, a step needed prior to performance of an operation on all (e.g., both) pixel streams, the method may determine the latency of each pixel stream to appropriately set the size of synchronization data structures, e.g., FIFOs (First In First Out data buffers) needed for synchronization. Note that the resulting generated graphical program code may be inherently different from that generated by prior art techniques, at least because the generated graphical program code may involve feedback nodes (that provide synchronization signals) that carry information to previous nodes regarding whether the next node is ready to accept incoming data. One example of such synchronization signals utilizes Boolean "Ready for Input" and "Ready for Output" signals, indicating readiness of graphical program nodes to send or receive valid data. Additional exemplary signals may include Booleans such as "Input Valid", which specifies that the next pixel has arrived for processing, "Output Valid", which indicates that the current pixel produced by the node is valid and ready to be used by downstream nodes, "Ready for Output", which specifies whether the downstream node can accept a new pixel, and "Ready for Input", which indicates whether the node can accept a new pixel during the next clock cycle, among others.

For example, when parallel streams are created, then merged, the graphical code generation part of the method may need to keep track of the nodes already dropped to which the synchronization signals need to be connected. More specifically, when a stream is branched to create two parallel streams, "Ready for Input" outputs (synchronization signals) of the first nodes of each parallel stream may be required to be (logically) ANDed and connected to "Ready for Output" input of the last node before the branching. Conversely, when two streams are synchronized (merged), the Ready for Input output of the synchronization node may be required to be connected the Ready for Output input of the last nodes of each parallel stream.

Figure 9A:
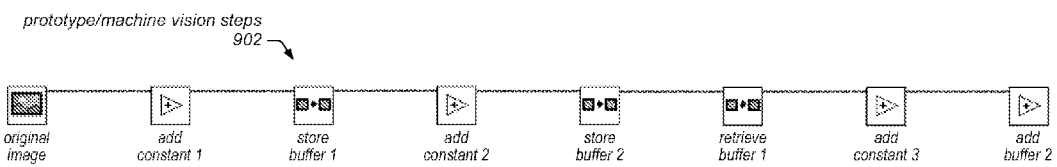
FIGS. 9A and 9B respectively illustrate an exemplary machine vision prototype, and a corresponding parallelized graphical program with synchronization signals, according to one embodiment.
Figure 9B:
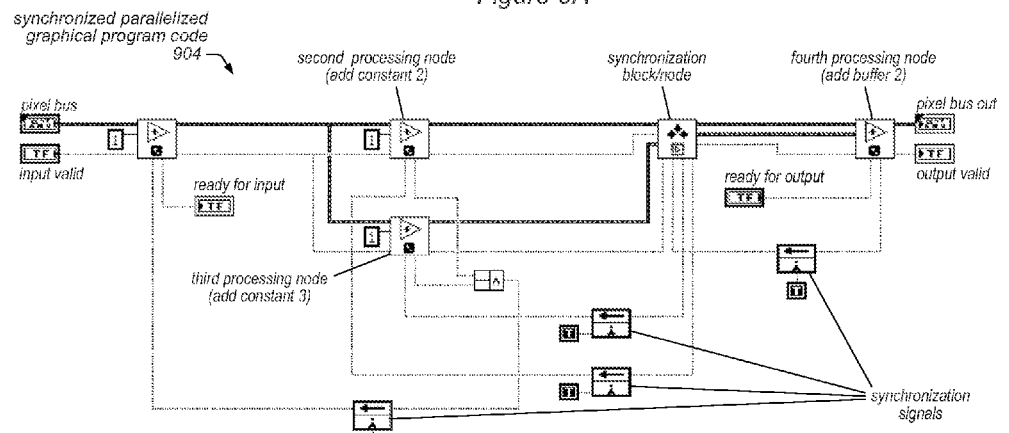

FIGS. 9A and 9B respectively illustrate an exemplary machine vision prototype 902, and a corresponding parallelized graphical program 904 with synchronization signals, according to one embodiment. As may be seen in FIG. 9A, the machine prototype 902 includes respective steps that process a received image (see Original Image icon in FIG. 9A), specifically, an "Add Constant 1" step that adds a constant to each pixel of the original image, and provides the resulting pixel stream to a "Store Buffer 1" step that stores the pixel stream data in a first buffer and also passes the pixel stream to an "Add Constant 2" step that adds a second constant and passes the resulting pixel stream to a "Store Buffer 2" step, which stores the pixel stream in a second buffer, and also passes the pixel stream to the next step, which is a "Retrieve Buffer 1" step, which retrieves the pixel stream data from the first buffer and passes it to an "Add Constant 3" step, which adds a third constant to the retrieved pixel stream, and passes the result to an "Add Buffer 2" step, which adds the contents of buffer 2 to the modified pixel stream received from the "Add Constant 3" step.

FIG. 9B shows an exemplary graphical program 904 generated from the prototype 902, which, in addition to parallelizing graphical program function nodes corresponding to the "Add Constant 2" and "Add Constant 3" steps, based on the above described heuristics, and adding a synchronization block/node, the generated graphical program includes various synchronization signals that when implemented on a hardware accelerator may be used to synchronize functionality implemented thereon.

Thus, in one embodiment, generating the graphical program may further include determining synchronization signals for the determined parallelism, and generating graphical program code implementing the synchronization signals, where during operation on the hardware accelerator, the synchronization signals may be used to synchronize the parallelized at least a portion of the image processing (algorithm).

Another aspect of some embodiments of the present techniques is real-time estimation of the hardware accelerator (e.g., FPGA) resources used by the image processing algorithm being developed by the user. For example, as the user builds the machine vision image processing algorithm (e.g., in a Vision Assistant editor), and inserts new steps (e.g., to the Vision Assistant script, the method may update a resource utilization estimate, providing a real-time estimation of such hardware resources as registers, LUTs, DSP 48s, and/or block RAM, used by the hardware accelerator, although it should be noted that these hardware resources are exemplary only, and that other resources may be utilized and estimated as desired.

Accordingly, as indicated in 610, the method may also include estimating, based on the analyzing of 608, resource usage or performance of the image processing algorithm for the hardware accelerator, and as FIG. 6 also shows, in 612, the estimated resource usage or performance may be displayed, e.g., on a display of computer 82. The estimated resource usage or performance may be usable for target platform selection or modification of the machine vision image processing algorithm.

Figure 10:
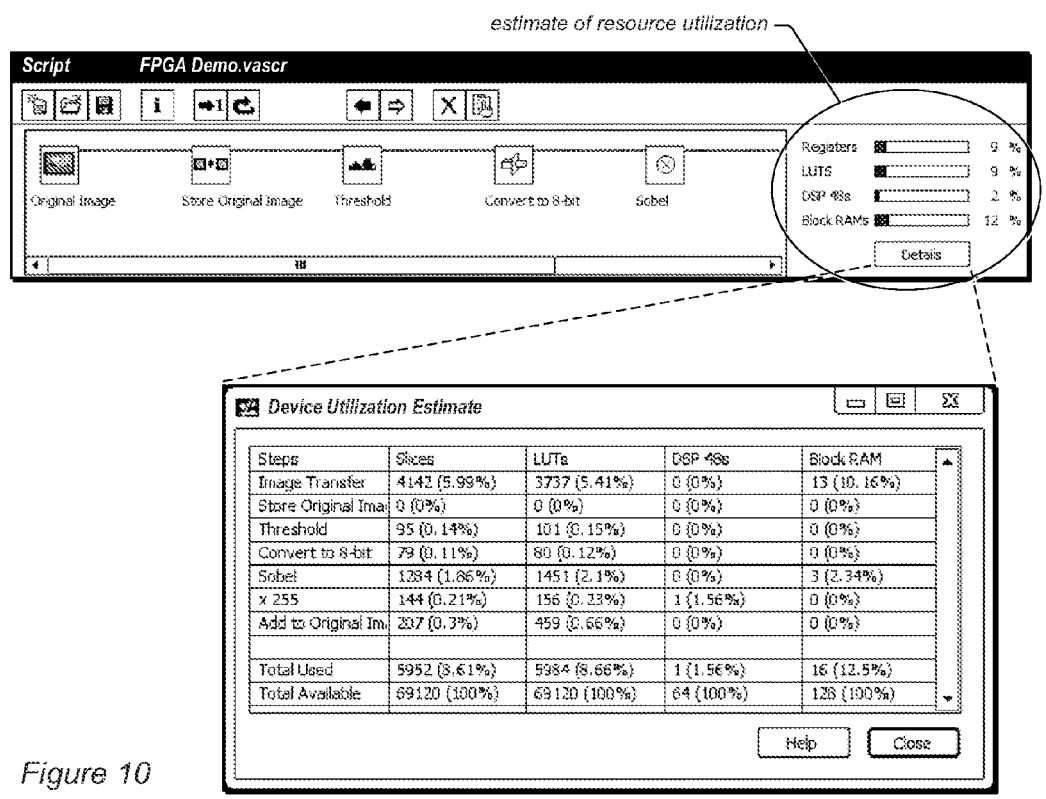
FIG. 10 illustrates display of an exemplary estimate of resource utilization of a programmable hardware implementation of a machine vision prototype via an exemplary graphical user interface, according to one embodiment.

FIG. 10 illustrates display of an exemplary estimate of resource utilization of a programmable hardware (in this exemplary case, an FPGA) implementation of a machine vision prototype via an exemplary graphical user interface (GUI), according to one embodiment. As shown, in this exemplary example, a high level display of the estimates are presented along with the associated machine vision prototype (see sequence of image processing steps to the left of the estimates). In the embodiment shown, the estimates are displayed as respective bar graphs and numeric values for estimated usage of registers (9%), look-up tables (LUTS) (9%), DSP 48s (2%), and block RAMs (12%), although it should be noted that in other embodiments, any types of information display may be used as desired. As also shown, the exemplary GUI further provides a "Details" button whereby more detailed information regarding the estimated resource usage may be displayed, e.g., more detailed information on a step by step basis. In one embodiment, the selection or specification of the hardware accelerator (e.g., FPGA) based target used when performing the method may result in provision of respective percentage of resources used for the hardware accelerator used in that target.

In some embodiments, these estimations may be determined by the analysis at least in part using a lookup table. For example, a tool, e.g., Vision Assistant may contain or access a database of resources used by each of a number of hardware directed graphical programs (e.g., VIs) and/or precompiled IP blocks that can potentially be used. This database may be created offline by analyzing results and reports regarding the compilation of these graphical programs/VIs, e.g., generated by the LabVIEW™ FPGA compiler and associated Xilinx tools.

In some embodiments, each step in a machine vision prototype may have knowledge/data regarding a low level machine vision graphical program (or VI), to be generated (based on the parameters entered by the user for the step, and the image type). By analyzing the machine vision prototype, and identifying the graphical programs (VIs) that are going to be used, the results may be displayed in a GUI, e.g., the Vision Assistant UI. In order to provide the most accurate results, the database may store the resource(s) used by each graphical program (VI) on the different types of hardware accelerator, e.g., the programmable hardware element (e.g., FPGA Virtex™, Zyng™, and Kintex™ FPGAs) or GPU used.

As noted above, in some embodiments, performance of a hardware implementation of the image processing algorithm (or machine vision prototype) may be estimated and displayed. Thus, in one embodiment, the method (or a software tool performing the method, e.g., Vision Assistant) may include or access a database of values for the latency of hardware directed VIs that can be generated. This information may be used to synchronize multiple streams and to provide performance information for hardware implementation of the image processing algorithm being developed. Note that after an initial latency period, performance on a hardware accelerator (e.g., FPGA or GPU) may only depend on the image size, frequency clock, and transfer time of the image from the host to the hardware accelerator and back.

Figure 11:
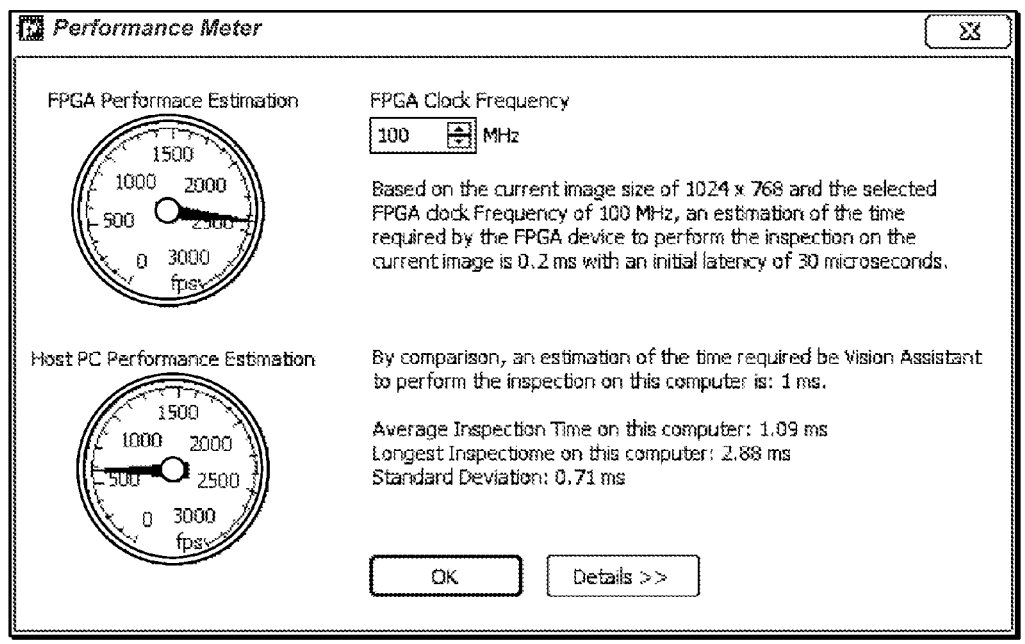
FIG. 11 illustrates display of exemplary estimated performance of a programmable hardware implementation of a machine vision prototype and a processor based implementation via an exemplary graphical user interface, according to one embodiment.

FIG. 11 illustrates display of exemplary estimated performance of a programmable hardware implementation of a machine vision prototype and a processor based implementation via an exemplary graphical user interface, according to one embodiment. Note that in this exemplary embodiment, the programmable hardware is an FPGA. As shown, in this example, performance of the FPGA implementation is estimated to be a slightly under 2500 frames per second (fps), based on a (settable) 100 MHz FPGA clock frequency, and an image size of 1024×768 pixels. Moreover, as indicated, an estimation of the time required by the FPGA device to perform the image processing (e.g., inspection) on the image is estimated to be 0.2 ms, with an initial latency of 30 microseconds.

As also shown, in this particular embodiment, performance of a host PC implementation of the machine vision image processing algorithm (as per the prototype) is also estimated to be ~600 fps, with estimated time required to process the image of 1 ms, with average inspection (image processing) time per image of 1.09 ms, longest inspection (image processing) time of 2.88 ms, and a stand deviation of 0.71 ms. Note the inclusion of a "Details" button in the GUI, whereby further details of the estimates may be viewed. Note that in some embodiments, the performance estimate for the hardware (e.g., FPGA) implementation may be determined as part of the method or techniques disclosed herein, the performance estimates regarding the host computer implementation may be determined outside the scope of the present method and provided to the method for comparison. In other words, while the GUI of FIG. 11 shows estimates for both implementations, the host computer based estimates may have been determined elsewhere (and prior) and stored, and retrieved by the user (or the method) as needed.

In some embodiments, the above storing, emulating or simulating, displaying the image processing results, analyzing, estimating, and displaying the estimated resource usage or performance, may be performed prior to generating the graphical program code. Moreover, the storing, emulating or simulating, displaying the image processing results, analyzing, estimating, and displaying the estimated resource usage or performance, may be repeated one or more times in an iterative manner, allowing the user to modify the prototype (via an editor) one or more times based on the displayed estimates. Thus, in some embodiments, the method may further include receiving user input modifying the machine vision prototype (e.g., based on the displayed estimates and/or the displayed image processing results for validation), and performing the method elements 602-612 with respect to the modified prototype. More generally, this process may be performed iteratively, thereby allowing the user to interactively modify or refine the image processing algorithm until a graphical program with acceptable resource usage and performance is generated. Note that since this iterative process does not require (the quite lengthy) compilation of the graphical program (for hardware implementation), iterative design time for a hardware implementation of an image processing algorithm (prototype) may be dramatically shortened.

In some embodiments, the hardware accelerator may be or include a programmable hardware element, and the method may further include generating a hardware configuration program based on the graphical program code, where the hardware configuration program is deployable to the programmable hardware element for hardware implementation of the machine vision image processing algorithm. In a further embodiment, the method may also include deploying the generated hardware configuration program to a target programmable hardware element (or device that includes such). In other words, the hardware configuration program may be used to configure a programmable hardware element, thereby implementing the (parallelized, etc.) image processing algorithm or prototype in hardware.

In addition to the speeding the iterative design process, assuming that there are enough resources on the programmable hardware element (e.g., FPGA) target, the generated graphical program (code) is guaranteed to compile, providing a much faster way to create a hardware configuration program.

In one embodiment, the hardware accelerator may be or include a graphics processing unit (GPU), and the method may include compiling the graphical program code for execution on the GPU, thereby generating an executable program that is deployable to the GPU for hardware implementation of the machine vision image processing algorithm.

In one embodiment, the LabVIEW™ graphical programming development environment, also provided by National Instruments Corporation, may be used (by the method) to create the graphical program. For example, the graphical program may be created on the computer system 82 (or on a different computer system) based on analysis of the machine vision prototype via the LabVIEW™ graphical programming development environment. The graphical program may comprise a plurality of (possibly interconnected)

nodes or icons which visually indicates the functionality of the program. As noted above, the graphical program may comprise a block diagram and may also include a user interface portion or front panel portion. In some embodiments, where the graphical program includes a user interface portion, the user may optionally assemble the user interface on the display.

Exemplary Creation of a Graphical Program

The following describes exemplary creation of a graphical program, according to various embodiments. The graphical program may implement an embodiment of the techniques disclosed herein.

First, a graphical program may be created on the computer system 82 (or on a different computer system). The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW™ graphical programming development environment to create the graphical program.

In an alternate embodiment, the graphical program may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A non-transitory computer accessible memory medium that stores program instructions executable by a processor to implement:

storing a machine vision prototype, the machine vision prototype comprising:

a plurality of machine vision steps, wherein the plurality of machine vision steps specifies a machine vision image processing algorithm and associated parameters, and wherein the plurality of machine vision steps is interpretable by an emulator to perform the specified image processing on an image by emulating or simulating execution of the plurality of machine vision steps by a hardware accelerator;

analyzing the machine vision prototype;

automatically generating, based on said analyzing, a graphical program implementing the specified image processing algorithm, wherein the graphical program parallelizes at least a portion of the image processing, and wherein the graphical program is targeted for deployment to the hardware accelerator;

estimating resource usage or performance of execution of the graphical program by the hardware accelerator;

based on the estimated resource usage or performance, determining that the hardware accelerator is capable of executing the graphical program; and based on the determination that the hardware accelerator is capable of executing the graphical program, deploying the graphical program to the hardware accelerator.

2. The non-transitory computer accessible memory medium of claim 1, wherein said analyzing comprises:

applying one or more heuristics to determine maximum parallelism of the machine vision image processing algorithm that can be implemented on the hardware accelerator.

3. The non-transitory computer accessible memory medium of claim 1, wherein said generating a graphical program comprises:

determining synchronization signals for the determined parallelism; and generating graphical program code implementing the synchronization signals, wherein during operation on the hardware accelerator, the synchronization signals are used to synchronize the parallelized at least a portion of the image processing.

4. The non-transitory computer accessible memory medium of claim 1, wherein said storing, said emulating or simulating, said displaying the image processing results, said analyzing, said estimating, and said displaying the estimated resource usage or performance, are performed prior to said generating the graphical program code.

5. The non-transitory computer accessible memory medium of claim 1, wherein the hardware accelerator comprises a programmable hardware element, and wherein the program instructions are further executable by a processor to implement:

generating a hardware configuration program based on the graphical program code, wherein the hardware configuration program is deployable to the programmable hardware element for hardware implementation of the machine vision image processing algorithm.

6. The non-transitory computer accessible memory medium of claim 1, wherein the hardware accelerator comprises a graphics processing unit (GPU), and wherein the program instructions are further executable by a processor to implement:

compiling the graphical program code for execution on the GPU, thereby generating an executable program that is deployable to the GPU for hardware implementation of the machine vision image processing algorithm.

7. The non-transitory computer accessible memory medium of claim 1, wherein the plurality of machine vision steps comprises non-executable machine vision steps.

8. The non-transitory computer accessible memory medium of claim 1, wherein the plurality of machine vision steps comprises a sequence of machine vision steps.

9. The non-transitory computer accessible memory medium of claim 1, wherein the program instructions are further executable by the processor to implement:

emulating or simulating, via the emulator, execution of the plurality of machine vision steps on the hardware accelerator, thereby generating image processing results; and displaying, on a display, the image processing results for validation of said emulating or simulating by a user.

10. The non-transitory computer accessible memory medium of claim 1, wherein the program instructions are further executable by the processor to implement:
  displaying, on a display, the estimated resource usage or performance; and
  modifying, by a user, the image processing algorithm based on the displayed resource usage or performance.

11. A computer implemented method, comprising:
  utilizing a computer to perform:
    storing a machine vision prototype in a memory medium, the machine vision prototype comprising:
      a plurality of machine vision steps, wherein the plurality of machine vision steps specifies a machine vision image processing algorithm and associated parameters, and wherein the plurality of machine vision steps is interpretable by an emulator to perform the specified image processing on an image by emulating or simulating execution of the plurality of machine vision steps on a hardware accelerator;
    analyzing the machine vision prototype;
    automatically generating, based on said analyzing, a graphical program implementing the specified image processing algorithm, wherein the graphical program parallelizes at least a portion of the image processing, wherein the graphical program comprises a plurality of interconnected nodes that visually indicate functionality of the graphical program, and wherein the graphical program is targeted for deployment to the hardware accelerator;
    estimating resource usage or performance of execution of the graphical program by the hardware accelerator;
    based on the estimated resource usage or performance, determining that the hardware accelerator is capable of executing the graphical program; and
    based on the determination that the hardware accelerator is capable of executing the graphical program, deploying the graphical program to the hardware accelerator.

12. The method of claim 11, wherein said analyzing comprises:
  applying one or more heuristics to determine maximum parallelism of the machine vision image processing algorithm that can be implemented on the hardware accelerator.

13. The method of claim 11, wherein said generating a graphical program comprises:
  determining synchronization signals for the determined parallelism; and
  generating graphical program code implementing the synchronization signals, wherein during operation on the hardware accelerator, the synchronization signals are used to synchronize the parallelized at least a portion of the image processing.

14. The method of claim 11, wherein said storing, said emulating or simulating, said displaying the image processing results, said analyzing, said estimating, and said displaying the estimated resource usage or performance, are performed prior to said generating the graphical program code.

15. The method of claim 11, wherein the hardware accelerator comprises a programmable hardware element, and wherein the program instructions are further executable by a processor to implement:
  generating a hardware configuration program based on the graphical program code, wherein the hardware configuration program is deployable to the hardware accelerator for hardware implementation of the machine vision image processing algorithm.

16. The method of claim 11, wherein the hardware accelerator comprises a graphics processing unit (GPU), and wherein the program instructions are further executable by a processor to implement:
  compiling the graphical program code for execution on the GPU, thereby generating an executable program that is deployable to the GPU for hardware implementation of the machine vision image processing algorithm.

17. The method of claim 11, wherein the plurality of machine vision steps comprises non-executable machine vision steps.

18. The method of claim 11, wherein the plurality of machine vision steps comprises a sequence of machine vision steps.

19. The method of claim 11, the method further comprising:
  emulating or simulating, via the emulator, execution of the plurality of machine vision steps on the hardware accelerator, thereby generating image processing results; and
  displaying, on a display, the image processing results for validation of said emulating or simulating by a user.

20. The method of claim 11, the method further comprising:
  displaying, on a display, the estimated resource usage or performance; and
  modifying, by a user, the image processing algorithm based on the displayed resource usage or performance.

21. A system, comprising:
  a processor;
  a memory, coupled to the processor; and
  a display, coupled to the processor and memory;
  wherein the memory stores program instructions executable by the processor to:
    store a machine vision prototype, the machine vision prototype comprising:
      a plurality of machine vision steps, wherein the plurality of machine vision steps specifies a machine vision image processing algorithm, and wherein the plurality of machine vision steps is interpretable by an emulator to perform the specified image processing on an image by emulating or simulating execution of the plurality of machine vision steps on a hardware accelerator;
    analyze the machine vision prototype;
    automatically generate, based on said analyzing, a graphical program implementing the specified image processing algorithm, wherein the graphical program parallelizes at least a portion of the image processing, and wherein the graphical program is targeted for deployment to the hardware accelerator;
    estimate resource usage or performance of execution of the graphical program by the hardware accelerator;
    based on the estimated resource usage or performance, determine that the hardware accelerator is capable of executing the graphical program; and
    based on the determination that the hardware accelerator is capable of executing the graphical program, deploy the graphical program to the hardware accelerator.

22. The system of claim 21, wherein the program instructions are further executable by the processor to:

emulate or simulate, via the emulator, execution of the plurality of machine vision steps on the hardware accelerator, thereby generating image processing results; and display, on a display, the image processing results for validation of said emulating or simulating by a user.

23. The system of claim 21, wherein the program instructions are further executable by the processor to:

display, on a display, the estimated resource usage or performance; and modify, by a user, the image processing algorithm based on the displayed resource usage or performance.

* * * * *